United States Patent
Hsueh et al.

(10) Patent No.: US 11,830,770 B2
(45) Date of Patent: *Nov. 28, 2023

(54) SELF-ALIGNED SCHEME FOR SEMICONDUCTOR DEVICE AND METHOD OF FORMING THE SAME

(71) Applicant: Taiwan Semiconductor Manufacturing Co., Ltd., Hsin-Chu (TW)

(72) Inventors: Hsiu-Wen Hsueh, Taichung (TW); Cai-Ling Wu, Hsinchu (TW); Ya-Ching Tseng, Hsinchu (TW); Chii-Ping Chen, Hsinchu (TW); Neng-Jye Yang, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/749,303

(22) Filed: May 20, 2022

(65) Prior Publication Data
US 2022/0277991 A1    Sep. 1, 2022

Related U.S. Application Data

(63) Continuation of application No. 16/932,208, filed on Jul. 17, 2020, now Pat. No. 11,342,222.

(Continued)

(51) Int. Cl.
*H01L 21/768* (2006.01)
*H01L 23/522* (2006.01)
*H01L 23/532* (2006.01)

(52) U.S. Cl.
CPC .... *H01L 21/76834* (2013.01); *H01L 21/7685* (2013.01); *H01L 21/76831* (2013.01);
(Continued)

(58) Field of Classification Search
CPC ......... H01L 21/76834; H01L 21/76897; H01L 21/76883; H01L 21/7685; H01L 23/5226;
(Continued)

(56) References Cited

U.S. PATENT DOCUMENTS

| | | | |
|---|---|---|---|
| 7,368,377 | B2 | 5/2008 | Whelan et al. |
| 8,242,028 | B1 | 8/2012 | van Schravendijk et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |

(Continued)

*Primary Examiner* — Karen Kusumakar
(74) *Attorney, Agent, or Firm* — HAYNES AND BOONE, LLP

(57) ABSTRACT

Semiconductor device and the manufacturing method thereof are disclosed herein. An exemplary semiconductor device comprises an interlayer dielectric (ILD) layer disposed over a substrate; a first conductive feature at least partially embedded in the ILD layer; a dielectric layer disposed over and aligned with the ILD layer, wherein a top surface of the dielectric layer is above a top surface of the first conductive feature; an etch stop layer (ESL) disposed over the dielectric layer and over the first conductive feature; and a second conductive feature disposed on the first conductive feature, wherein the second conductive feature includes a first portion having a first bottom surface contacting a top surface of the first conductive feature and a second portion having a second bottom surface contacting a top surface of the dielectric layer.

20 Claims, 17 Drawing Sheets

Related U.S. Application Data

(60) Provisional application No. 62/906,136, filed on Sep. 26, 2019.

(52) U.S. Cl.
CPC .. *H01L 21/76832* (2013.01); *H01L 21/76883* (2013.01); *H01L 21/76897* (2013.01); *H01L 23/5226* (2013.01); H01L 23/53238 (2013.01); H01L 23/53266 (2013.01)

(58) Field of Classification Search
CPC ......... H01L 21/76831; H01L 21/76832; H01L 23/53266; H01L 23/53238; H01L 21/76829; H01L 21/76849; H01L 21/76861

See application file for complete search history.

(56) References Cited

U.S. PATENT DOCUMENTS

| | | | |
|---|---|---|---|
| 8,860,148 | B2 | 10/2014 | Hu et al. |
| 9,059,257 | B2 | 6/2015 | Li et al. |
| 9,105,490 | B2 | 8/2015 | Wang et al. |
| 9,236,267 | B2 | 1/2016 | De et al. |
| 9,236,300 | B2 | 1/2016 | Liaw |
| 9,460,997 | B2 | 10/2016 | Kuo et al. |
| 9,520,482 | B1 | 12/2016 | Chang et al. |
| 9,576,814 | B2 | 2/2017 | Wu et al. |
| 9,659,864 | B2 | 5/2017 | Wu et al. |
| 10,937,689 | B2 | 3/2021 | Chandhok et al. |
| 10,957,579 | B2 * | 3/2021 | Kim .................. H01L 21/76802 |
| 10,998,263 | B2 | 5/2021 | Liang et al. |
| 2004/0018748 | A1 | 1/2004 | Lu et al. |
| 2021/0098290 | A1 | 4/2021 | Hsueh et al. |

* cited by examiner

SELF-ALIGNED SCHEME FOR SEMICONDUCTOR DEVICE AND METHOD OF FORMING THE SAME

PRIORITY DATA

The present application is a continuation application of U.S. patent application Ser. No. 16/932,208, filed Jul. 17, 2020, which claims the benefit of U.S. Provisional Patent Application Ser. No. 62/906,136, filed Sep. 26, 2019, each of which is incorporated herein by reference in its entirety.

BACKGROUND

The electronics industry has experienced an ever-increasing demand for smaller and faster electronic devices which are simultaneously able to support a greater number of increasingly complex and sophisticated functions. These goals have been achieved by scaling down semiconductor IC dimensions (e.g., minimum feature size) and thereby improving production efficiency and lowering associated costs.

However, aggressive scaling down of IC dimensions has introduced increased complexity to the semiconductor manufacturing process and resulted in some issues of the semiconductor device. For example, aggressive scaling down of IC dimensions, i.e. smaller pitches and critical dimensions, has resulted in difficulties to control the distance between the conductive features, particularly the distance between the different levels of conductive features. For example, it has been observed that due to space dimension shrinkage, a via-to-line breakdown (tiger-tooth) may happen in the back-end of line (BEOL) during IC fabrication. The tiger-tooth issue may affect the device reliability, for example, reduce the time dependent dielectric breakdown (TDDB) and/or increase the parasitic capacitance of the semiconductor device. Thus, improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
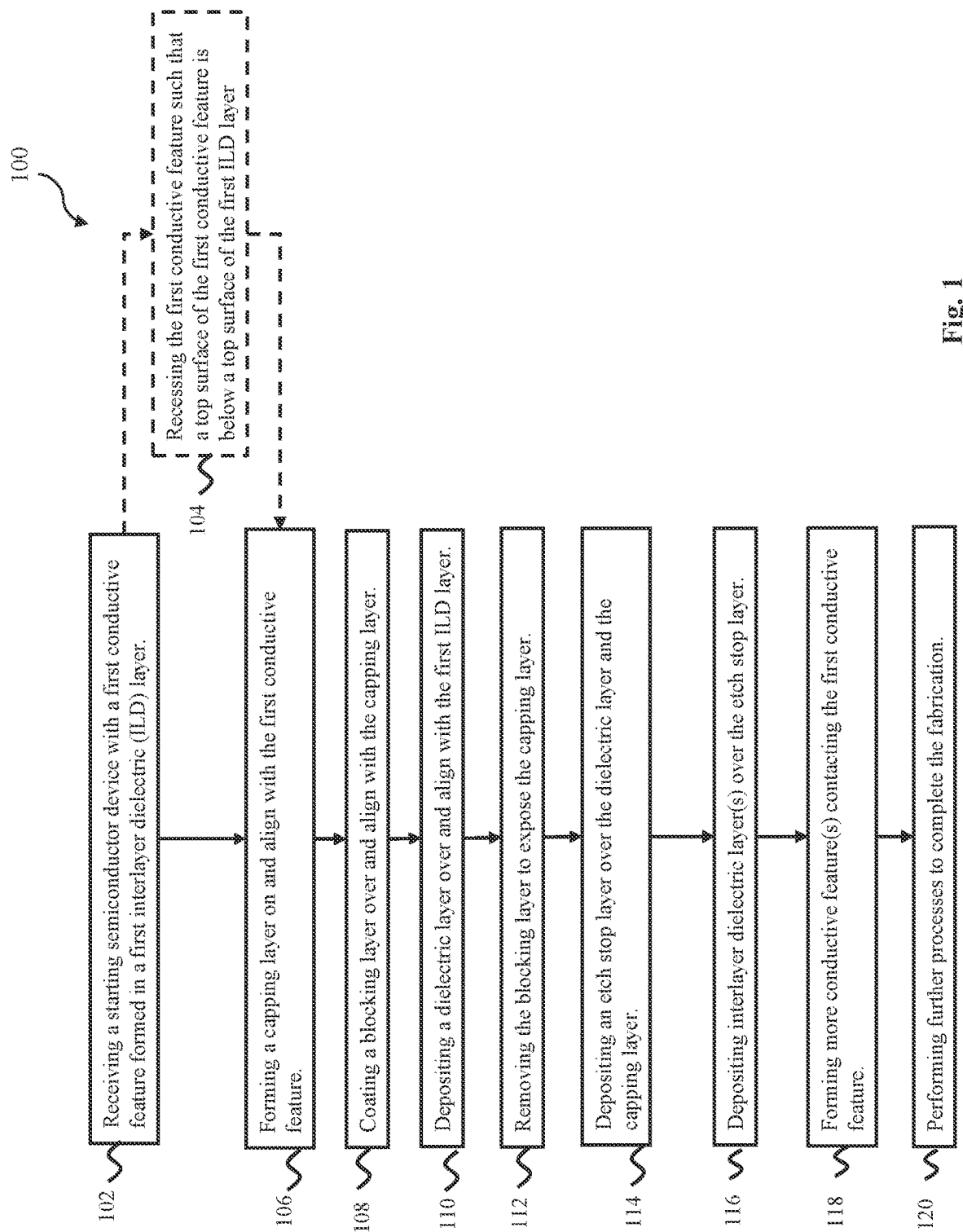
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to forming conductive features (such as metal lines and vias) with self-aligned scheme during the fabrication of an integrated circuit (IC).

Due to the aggressive scaling down of IC dimensions, overlay (mask shifting) issues have been observed in the fabrication of semiconductor devices. During the formation of interconnect layer(s), it is very difficult to control the distance between different levels of conductive features, such as distance between metal line and via, due to the smaller critical dimensions (CD) and the selectivity challenge between the adjacent materials. Via-to-line breakdown may happen between the adjacent conductive features, which may cause manufacturing defects and/or current leakage.

The present disclosure introduces a self-aligned scheme (SAS) for conductive feature formation, such that the via-to-line breakdown issue can be mitigated, and higher pattern density can be achieved. In the present disclosure, a dielectric SAS layer including metal oxide or metal nitride material is deposited over the lower level dielectric layer (for example, an interlayer dielectric (ILD) layer) without touching the lower level conductive feature (for example, a metal line). Thereafter, when forming the higher level conductive feature (for example, a via), the dielectric SAS layer will block the higher level conductive feature from breaking down to the lower level dielectric layer. Accordingly, the higher level conductive feature may include a first portion landing on the lower level conductive feature and a second portion landing on the dielectric SAS layer. Thereby, the distance between the adjacent lower level conductive feature and the higher conductive feature can be increased. In some embodiments, an extra recessing process is performed to the lower level conductive feature to further enlarge the distance between the adjacent lower level conductive feature and the higher level conductive feature. Therefore, the via-to-line breakdown issue may be mitigated, the parasitic capacitance may be reduced, and the performance of the semiconductor device may be improved. Of course, these advantages are merely example, and no particular advantage is required for any particular embodiment.

FIG. 1 illustrates a flow chart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various cross-sectional views of device 200 during intermediate steps of method 100. In particular, FIGS. 2-8 illustrate cross-sectional views of the device 200 according to some embodiments of the present disclosure; and FIGS. 9-16 illustrate cross-sectional views of the device 200 during fabrication steps according to some other embodiments of the present disclosure.

Device 200 may be an intermediate device fabricated during processing of an integrated circuit (IC), or a portion thereof, that may include static random-access memory (SRAM) and/or other logic circuits, passive components such as resistors, capacitors, and inductors, and active components such as p-type FETs (PFETs), n-type FETs (NFETs), FinFETs, GAA transistors, metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices. FIGS. 2-16, 17A and 17B have been simplified for the sake of clarity to better understand the inventive concepts of the present disclosure. Additional features can be added in device 200, and some of the features described below can be replaced, modified, or eliminated in other embodiments of device 200.

Figure 2:
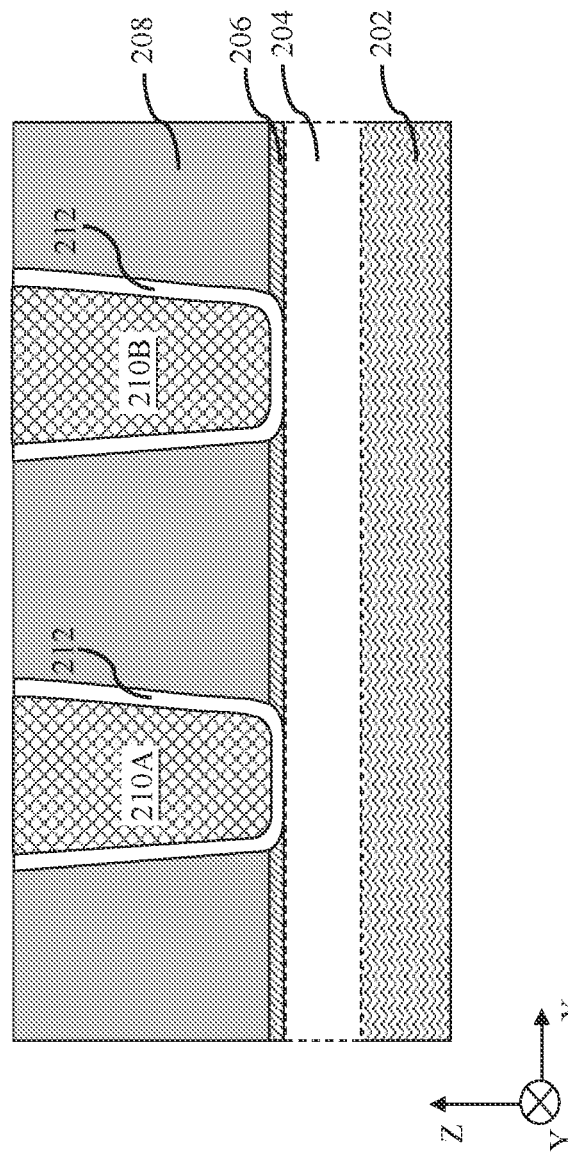
FIGS. 2-8 illustrate cross-sectional views of the example semiconductor device at intermediate stages of the method of FIG. 1 in accordance with some embodiments of the present disclosure.

Referring to FIGS. 1 and 2, at operation 102, method 100 provides a starting device 200. In the depicted embodiment of FIG. 2, device 200 includes a substrate 202. In the depicted embodiment, substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadnium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some examples, substrate 202 includes n-type doped regions (for example, n-type wells) doped with n-type dopants, such as phosphorus (for example, $^{31}P$), arsenic, other n-type dopant, or combinations thereof. In the depicted implementation, substrate 202 includes p-type doped region (for example, p-type wells) doped with p-type dopants, such as boron (for example, $^{11}B$, $BF_2$), indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Device 200 also includes a structure 204 disposed over substrate 202. Structure 204 is a part of a multilayer interconnect feature (MIF) configured to connect the various features of device 200 to form a functional circuit. In some embodiments, structure 204 may be a part of an interlayer dielectric (ILD) layer which may include a dielectric material, such as SiO, SiON, TEOS formed oxide, PSG, BPSG, a low-k dielectric material (K<3.9), or combinations thereof. In some other embodiments, structure 204 may be a conductive structure which is part of an electrode of a transistor, such as a source electrode, a drain electrode, or a gate electrode. A source (or drain) electrode may include n-type doped silicon for NFETs, p-type doped silicon germanium for PFETs, or other suitable materials. A source (or drain) electrode may also include silicide such as nickel silicide, titanium silicide, cobalt silicide, or other suitable silicidation or germanosilicidation. A gate electrode may include aluminum, tungsten, cobalt, and/or other suitable materials. In some other embodiments, structure 204 may be a conductive structure which is part of a contact feature such as a source contact, a drain contact, or a gate contact, and may include cobalt, tungsten, ruthenium, rhodium, iridium, molybdenum, other metals, a metal nitride such as titanium nitride or tantalum nitride, or a combination thereof. In some embodiments, structure 204 may be a conductive structure which is part of an interconnect structure, such as a metal wire or a metal plug, and may include copper, cobalt, tungsten, ruthenium, rhodium, iridium, molybdenum, other metals, a metal nitride such as titanium nitride or tantalum nitride, or a combination thereof.

Device 200 also includes a first etch stop layer (ESL) 206 disposed over structure 204. In some embodiments, the first ESL 206 includes a dielectric material, such as a material that includes silicon, oxygen, and/or nitrogen. For example, the first ESL 206 may include aluminum oxide (AlOx), aluminum oxy-nitride (AlON), silicon carbide (SiC), silicon dioxide ($SiO_2$), silicon oxy-carbide (SiOC), silicon nitride (SiN), silicon carbonitride (SiCN), silicon oxy-nitride (SiON), silicon oxy-carbonitride (SiOCN), other dielectric material, or combinations thereof. The first ESL 206 may be formed by a deposition process, such as chemical vapor deposition (CVD), physical vapor deposition (PVD), atomic layer deposition (ALD), other suitable methods, or combinations thereof. The first ESL 206 is optional and may be omitted in some embodiments.

Device 200 also includes a first interlayer dielectric (ILD) layer 208 formed over substrate 202. The first ILD layer 208 includes a dielectric material such as SiO, SiON, TEOS formed oxide, PSG, BPSG, low-k dielectric material (K<3.9), other suitable dielectric material, or combinations thereof. Exemplary low-k dielectric materials include FSG, carbon doped silicon oxide, Black Diamond® (Applied Materials of Santa Clara, California), Xerogel, Aerogel, Parylene, BCB, SILK (Dow Chemical, Midland, Michigan), polyimide, other low-k dielectric material, or combinations thereof. The first ILD layer 208 may include a multi-layer structure having multiple dielectric materials and may be formed by a deposition process such as CVD, (for example, plasma enhanced CVD (PECVD), flowable CVD (FCVD)), spin-on-glass (SOG), other suitable methods, or combinations thereof. Subsequent to the deposition of the first ILD layer 208, a CMP process and/or other planarization process is performed to planarize the top surface of device 200.

Device 200 also includes first conductive features 210A and 210B (both referred to as first conductive features 210). The first conductive features 210 are also referred to as lower level conductive features, which may be conductive interconnect structures such as contacts, vias, or metal lines, such that conductive connections can be set up between the semiconductor components of device 200. In the depicted embodiment, the first conductive features 210 are metal lines (also referred to as metal lines 210). In some embodiments, metal lines 210 include a conductive material such as Ta, TaN, TiN, Cu, Co, Ru, Mo, W, other conductive material, or combinations thereof. In some embodiments, metal lines 210 are formed by PVD, CVD, ALD, plating, or other deposition process. In some embodiments, metal lines 210 are formed by a single damascene process or a dual damascene process. For example, in a single damascene process, first, a mask layer with a negative pattern (i.e. a pattern that is opposite to the pattern of metal lines 210) is deposited over the first ILD layer 208. The first ILD layer 208 is then patterned (by etching) along the mask layer to form metal line trenches therein. After removing the mask layer, a barrier layer 212, including a material such as Ta, TaN, Ti, TiN, other suitable material, or combinations thereof, is deposited over the patterned first ILD layer 208 and within the metal line trenches. Barrier layer 212 can provide diffusion barrier properties, which prevent diffusion of the conductive material (for example Cu) of metal lines 210 into the first ILD layer 208. Thereafter, a seed layer (not shown), including the conductive material of the metal line, is deposited over barrier layer 212. Subsequently, the conductive material of via 226 and metal line 228 is formed (for example, by electrochemical plating (ECP)) over the seed layer. And, a planarization process, such as CMP, is performed to device 200 to remove the excessive conductive material and to expose the top surface of the first ILD layer 208. The remained conductive material forms metal lines 210 (including metal lines 210A and 210B). Referring to FIG. 2, metal lines 210 and barrier layer 212 are exposed at the top surface of device 200. In the depicted embodiments, metal lines 210A and 210B extend in parallel in their lengthwise direction, that is along the y-direction.

Figure 3:
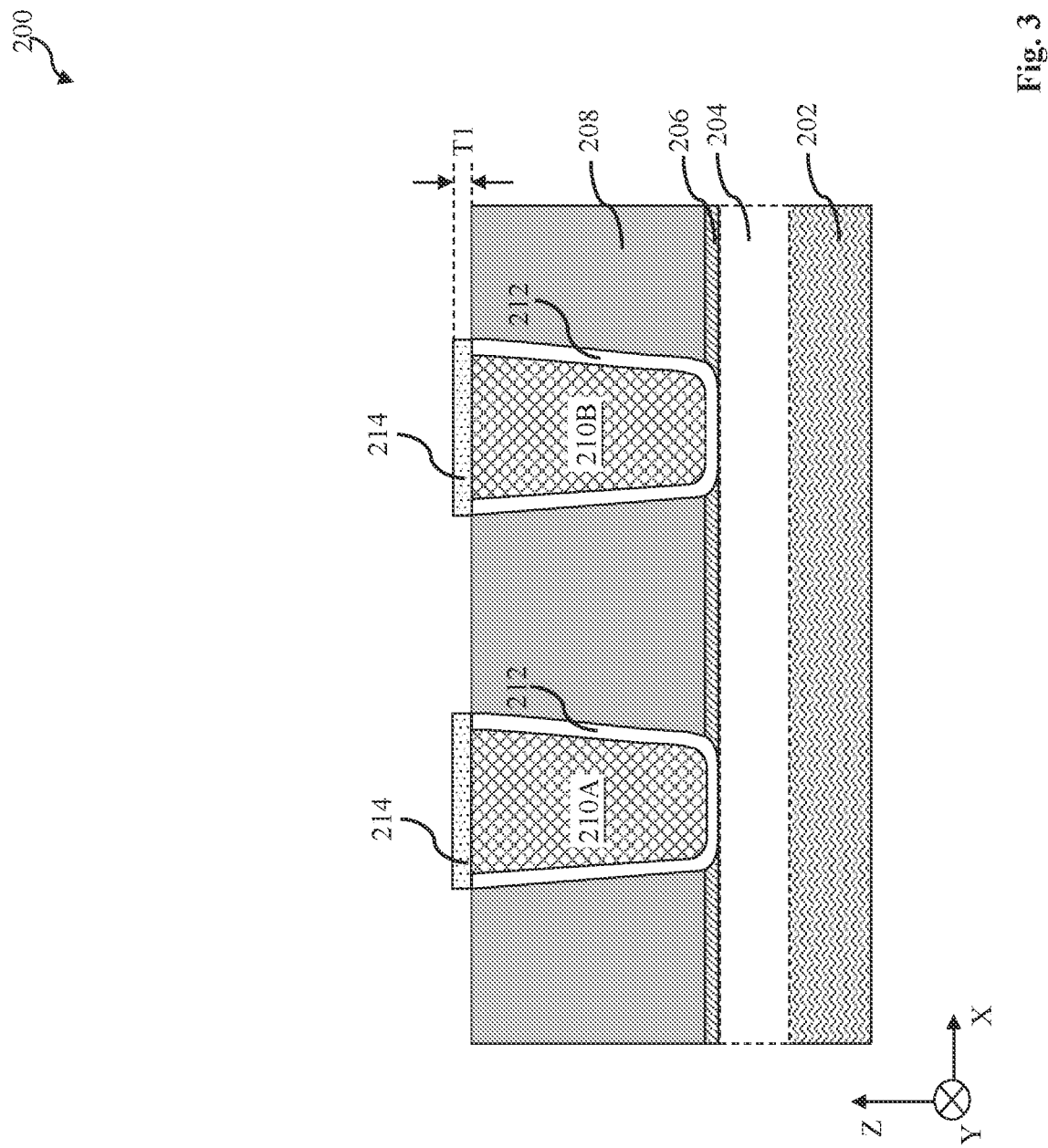

Referring to FIGS. 1 and 3, at operation 106, a capping layer 214 is formed over metal lines 210. As depicted in FIG. 3, capping layer 214 is formed on and aligned with the respective metal lines 210A and 210B as well as barrier layer 212. In other word, capping layer 214 is formed on the conductive materials (metal lines 210 and barrier layer 212) at the top surface of device 200, not the dielectric top surface of the first ILD layer 208. In some embodiment, capping layer 214 includes a conductive material, such as cobalt (Co). The Co capping layer 214 can protect metal lines 210 (for example, including Cu) from being oxidized and can increase the reliability of the Cu metal lines 210. In some embodiments, capping layer 214 is formed by a selective CVD, other selective metallic capping process, or combinations thereof. In some embodiments, a thickness T1 of capping layer 214 in the z-direction is about 2.5 nm to about 3.5 nm.

Figure 4:
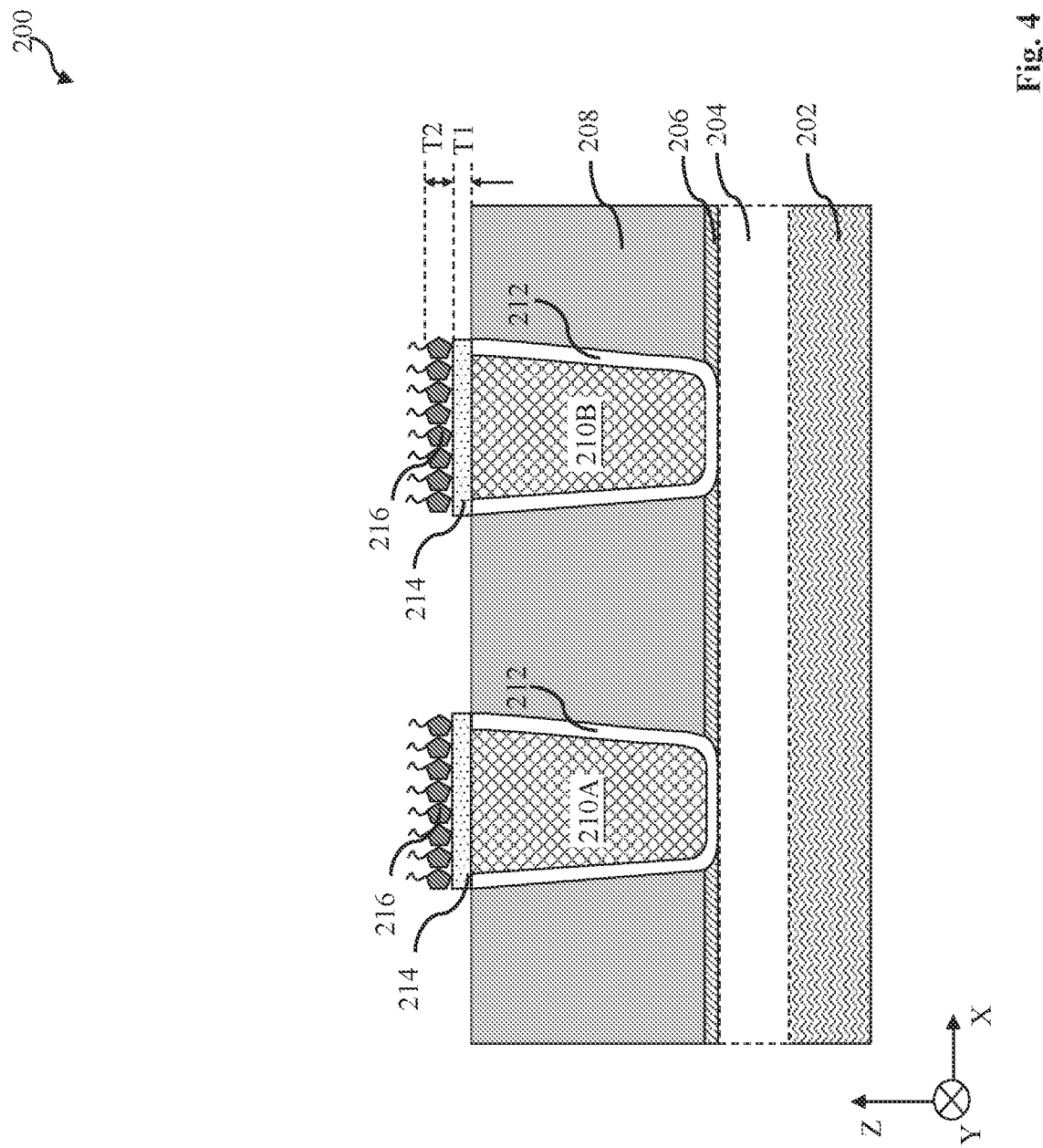

Referring to FIGS. 1 and 4, at operation 108, a blocking layer 216 is formed over capping layer 214. As depicted in FIG. 4, blocking layer 216 is coated on and aligned with capping layer 214. In other words, blocking layer 216 does not cover the top surface of the first ILD layer 208. In some embodiments, blocking layer 216 includes a self-assembling monolayer (SAM) material including hydrophobic head and hydrophobic tail groups. For example, blocking layer 216 comprises chemicals including phosphate group or high-nitrogen (hi-N) group. Blocking layer 216 may be an organic layer, a self-cross-link layer, a self-adhesion layer, other suitable layer, or combinations thereof. In some embodiments, the SAM blocking layer 216 is coated on capping layer 214 by a chemical adsorption process, such that the chemicals of blocking layer 216 is adsorbed only by the metal surface of capping layer 214, not the dielectric material of the first ILD layer 208 due to the different polarity. As depicted in FIG. 4, blocking layer 216 has a thickness T2 in the z-direction. Thickness T2 can be modulated depending on the distance D1 or D2 (see FIGS. 8, 9, 17, and 18) to be enlarged between the later formed higher level conductive feature (for example, via 226) and the adjacent lower level conducive feature (for example, metal line 210B). In some embodiments, thickness T2 is about 1.5 nm to about 4 nm.

Figure 5:
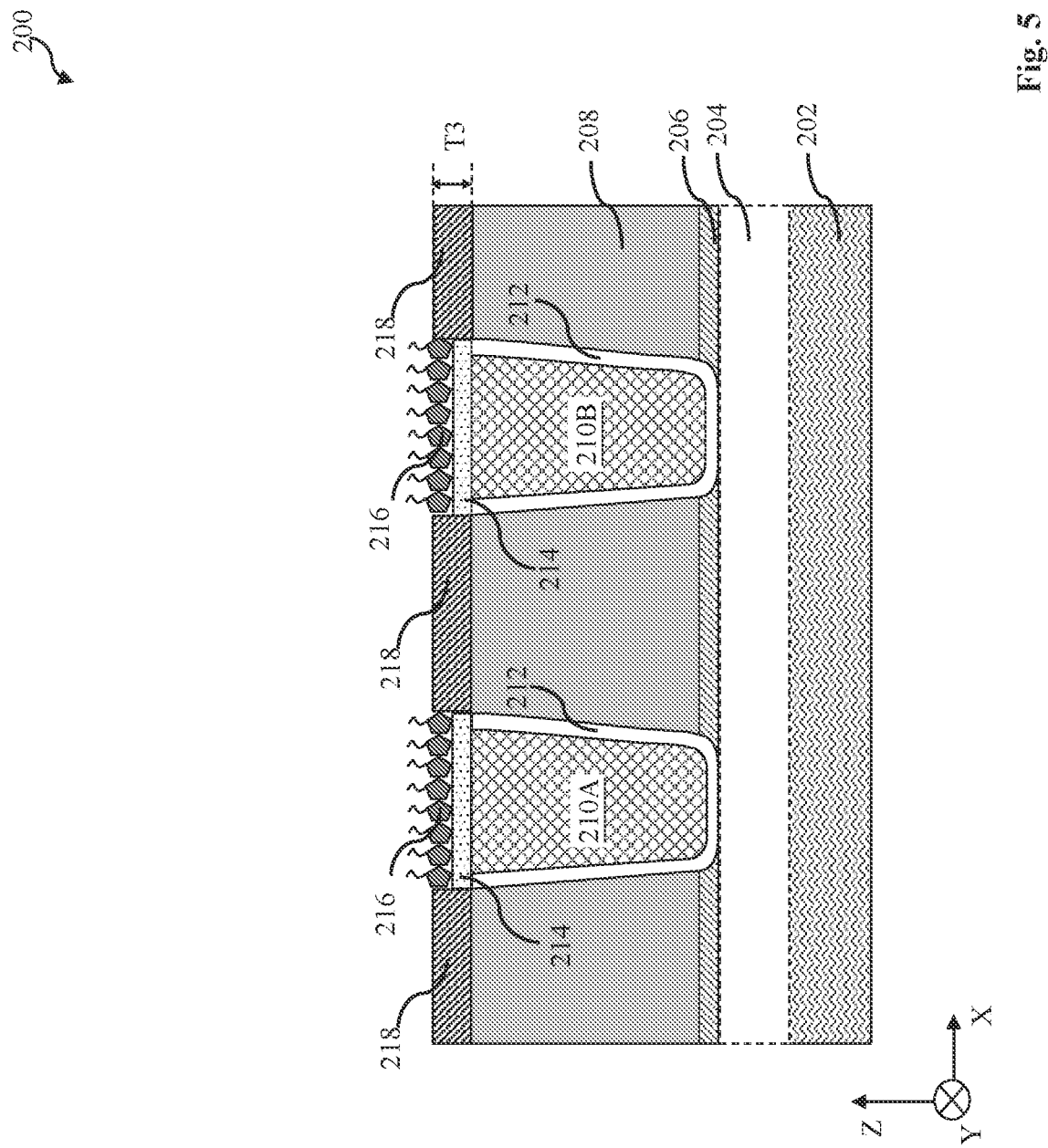

Referring to FIGS. 1 and 5, at operation 110, a dielectric layer 218 is formed over the first ILD layer 208. Dielectric layer 218 works as a self-align scheme layer (thus is also referred to as SAS layer 218) during the fabrication of the higher level conductive feature (for example via 226). SAS layer 218 can stop the tiger-tooth portion of the higher level conductive feature from breaking down to the first ILD layer 208, thereby to increase the distance between the higher level conductive feature (via 226) and the adjacent lower level conductive feature (metal line 210B) and mitigate the current leakage issue therebetween. As depicted in FIG. 5, SAS layer 218 is formed along sidewalls of capping layer 214 and blocking layer 216. In other words, SAS layer 218 is formed on and aligned with the first ILD layer 208, since it is blocked by blocking layer 216 formed on and aligned with metal lines 210. Referring to FIG. 5, SAS layer 218 has sidewall surfaces contacting sidewall surfaces of capping layer 214 and blocking layer 216. SAS layer 218 includes a material that can provide a different etching rate than that of the later formed second ESL 220 and the second ILD 222 (see, FIGS. 8 and 9), such that during the formation of the via trench, SAS layer 218 can remain substantially unchanged due to the different etching selectivity. In some embodiments, SAS layer 218 includes a metal oxide or metal nitride material, such as aluminum oxide ($Al_2O_3$), aluminum nitride ($Al_2N_3$), aluminum oxynitride (AlON), other suitable dielectric material, or combinations thereof. In some embodiments, SAS layer 218 is formed by a selective ALD process, such that it only forms on the top surface of the first ILD layer 208. As mentioned above, the first ILD layer 208 comprises low-k dielectric material (for example, SiO2) and blocking layer 216 comprises organic compound. The material of SAS layer 218 (for example, Al2O3, Al2N3, and/or AlON) only bond with the low-k material of the first ILD layer 208, not the SAM organic compound of blocking layer 216, due to the different chemical affinity. Referring to FIG. 5, SAS layer 218 has a thickness T3 which is greater than the thickness T1 of capping layer 214 in the z-direction. Similar as blocking layer 216, thickness T3 of SAS layer 218 can be modulated depending on the distance D1 or D2 (FIG. 8 or 16) to be enlarged between the later formed higher level conductive feature (for example, vias 226) and the adjacent lower level conducive feature (for example, metal line 210B). In some embodiments, thickness T3 is about 3 nm to about 5 nm.

Figure 6:
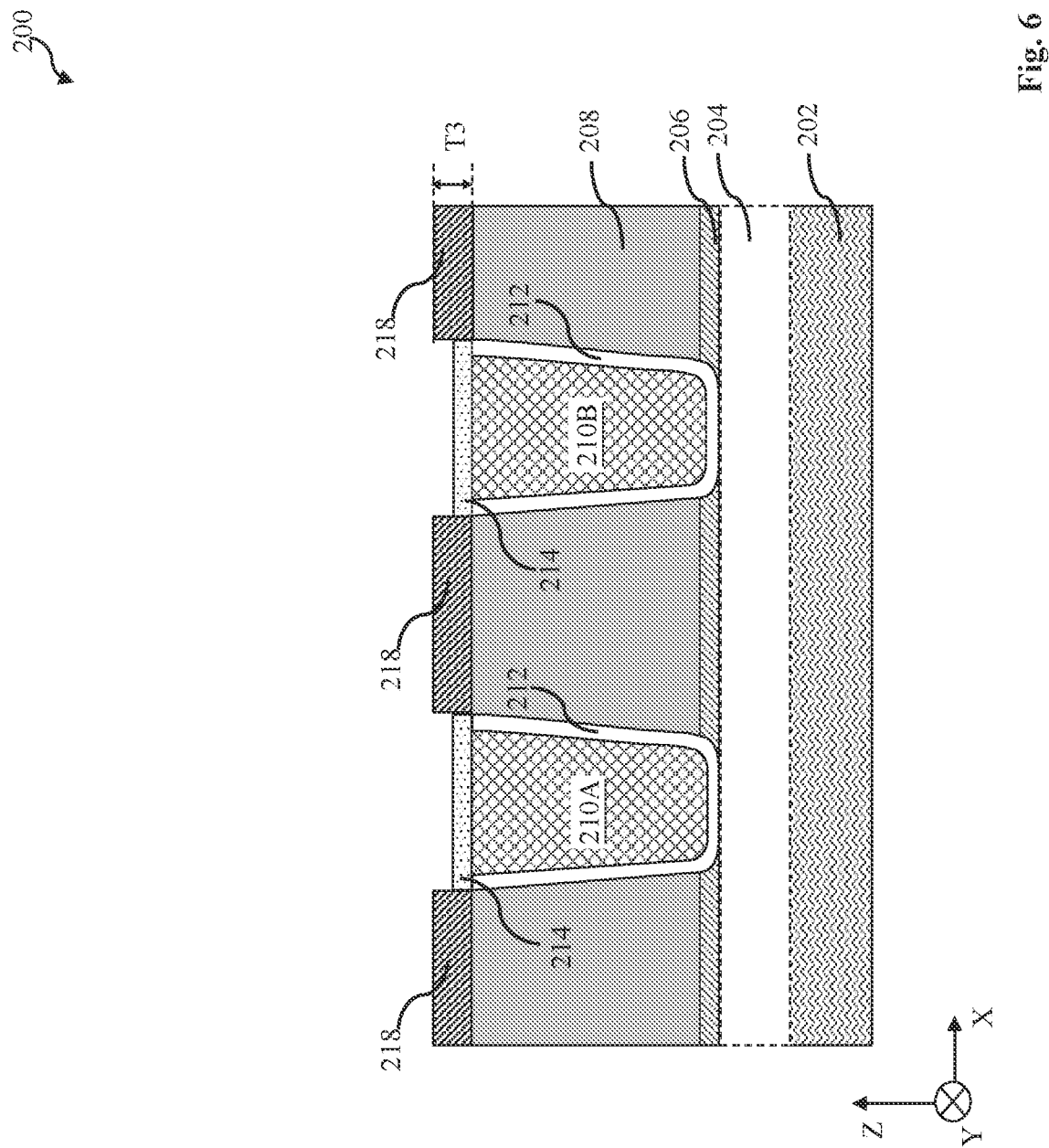

Referring to FIGS. 1 and 6, at operation 112, blocking layer 216 is removed, such that capping layer 214 is exposed at the top surface of device 200. In some embodiments, blocking layer 216 is removed by a hydrogen (H2) treatment. For example, a reacting gas including H2 (with a pressure of about 1 torr to about 3 torr) is applied to the top surface of device 200, the organic material of blocking layer 216 reacts with the H2 gas, thus blocking layer 216 can be removed. In some other embodiments, blocking layer 216 is removed by a nitrogen (for example, N2 or NH3) treatment at a temperature of about 250° C. to about 400° C. As depicted in FIG. 6, after removing blocking layer 216, SAS layer 218 includes sidewall surfaces contacting and extending above sidewall surfaces of capping layer 214.

Figure 7:
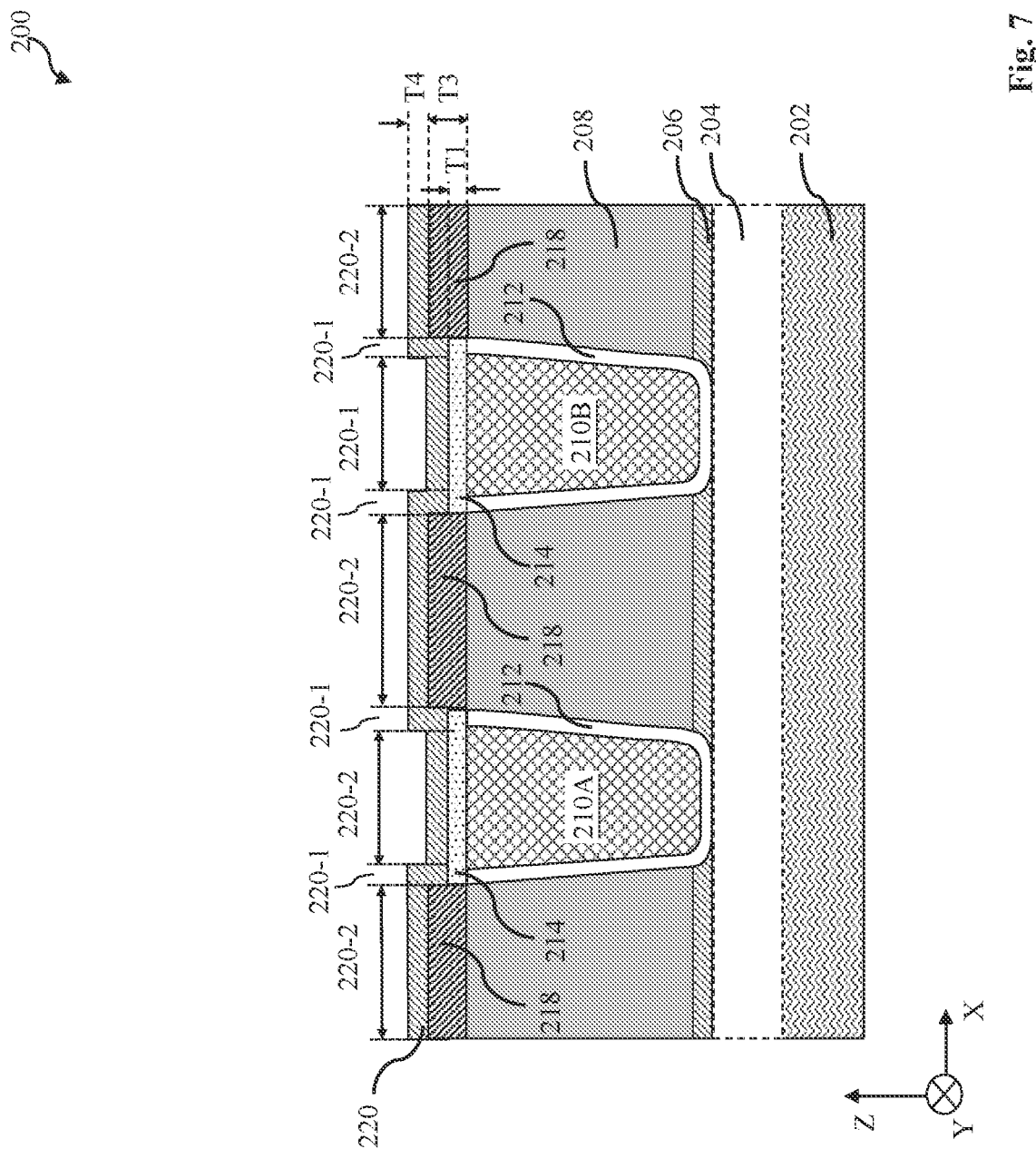

Referring to FIGS. 1 and 7, at operation 114, a second ESL 220 is deposited over device 200, in particular, over SAS layer 218 and capping layer 214. As depicted in FIG. 7, due to the thickness difference between SAS layer 218 and capping layer 214 (thickness T3 of SAS layer 218 is greater than thickness T1 of capping layer 214), the second ESL 220 extends from the top surfaces of SAS layer 218 to the top surfaces of capping layer 214. In the depicted embodiment, the second ESL 220 includes first portions 220-1 contacting portions of the sidewall surfaces of SAS layer 218 and second portions 220-2 covering the top surfaces of SAS layer 218 and the top surfaces of capping layer 214. The second ESL 220 includes a dielectric material that has a different etching rate than the dielectric material of SAS 218. In some embodiments, the second ESL 220 includes a dielectric material such as a material that includes silicon, oxygen, and/or nitrogen. For example, the second ESL 220 may include silicon carbide (SiC), silicon dioxide (SiO$_2$), silicon oxy-carbide (SiOC), silicon nitride (SiN), silicon carbonitride (SiCN), silicon oxy-nitride (SiON), silicon oxy-carbonitride (SiOCN), other dielectric material, or combinations thereof. The second ESL 220 may be formed by a deposition process, such as atomic layer deposition (ALD), other suitable methods, or combinations thereof. A thickness T4 of the second ESL 220 in the z-direction may be modulated due to the requirements of resistance/capacitance performance of device 200 and to mitigate the hillock issue thereof. In some embodiments, thickness T4 of the second ESL 220 in the z-direction is about 1 nm to about 3 nm.

Figure 8:
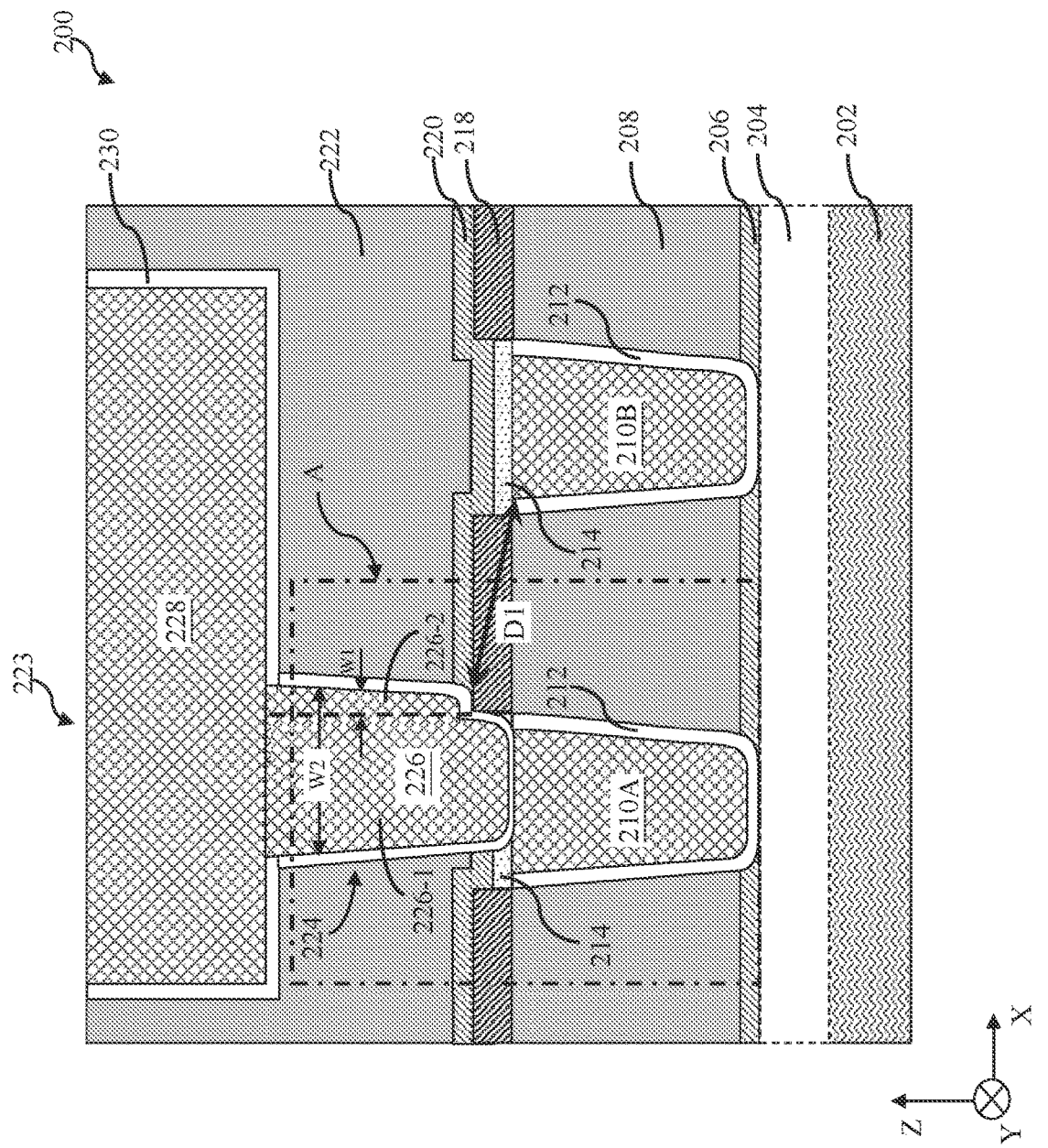

Now referring to FIGS. 1 and 8, at operations 116 and 118, more conductive features (i.e. higher level conductive feature(s)), for example, a via 226 and a metal line 228 are formed over one of the first conductive features 210 (i.e. a lower level conductive feature). The higher level conductive features can be formed by single damascene process, dual damascene process, other suitable process, or combinations thereof. For example, in a dual damascene process, at operation 116, a second ILD layer 222 is formed over the second ESL 220. The material of the second ILD layer 222 is different than that of SAS layer 218 to provide a different etching rate in the later metal line trench 223 and via trench 224 formation process. The fabrication of the second ILD layer 222 is similar as that of the first ILD 208.

Still referring to FIG. 8, at operation 118, a metal line trench 223 and a via trench 224 is patterned in the second ILD layer 222. Metal line trench 223 and via trench 224 form a "T" shape in the X-Z plane. Metal line trench 223 and via trench 224 can be formed by etching processes (such as dry etching, wet etching, or a combination thereof) via one or more patterned hard masks. The width and depth of the trenches are based on the design requirements of the device 200. Due to the small IC dimensions and the process restriction, a shifting may happen during the formation of metal line trench 223 and/or via trench 224. As depicted in FIG. 8, via trench 224 includes a main portion (the left side of the dashed line) landed over the metal line 210A and a shifting portion (the right side of the dashed line) landed over SAS layer 218.

Thereafter, a barrier layer 230, including a material such as Ta, TaN, Ti, TiN, other suitable material, or combinations thereof, is deposited in metal line trench 223 and via trench 224. Thereafter, a seed layer (not shown), including the conductive material of the via and/or the metal line, is deposited over barrier layer 230. Subsequently, the conductive material of via 226 and metal line 228 is formed (for example, by electrochemical plating (ECP)) over the seed layer in metal line trench 223 and via trench 224. The conductive material may include Ta, Ti, Al, Cu, Co, W, TiN, TaN, other suitable conductive materials, or combinations thereof. And, a planarization process, such as CMP, is performed to device 200 to remove the excessive conductive material and to expose the top surface of the second ILD layer 222. The conductive material in via trench 224 forms via 226 and the remained conductive material in metal line trench 223 forms metal line 228. As depicted in FIG. 8, via 226 includes a first portion 226-1 landed over metal line 210A and a second portion 226-2 landed over SAS layer 218. In some embodiments, a shifting ration, i.e. a ration of a width W1 of the second portion 226-2 to a width W2 of via 226 is about 15% to about 30%. Here, the width W1 and the width W2 are the average width of the second portion 226-2 and the average width of via 226 in the X-direction, respectively.

As discussed above, due to the small critical dimensions of device 200, it is difficult to ensure that the via trench is perfectly formed over metal line 210A, and overlay shifting issue often happens during the formation of the via trench. Thus, the via trench may include a main portion and a shifting portion. In a conventional semiconductor structure where no SAS layer 218 is formed, due to the selectivity challenge of the ILD layer and the ESL, materials of the ILD layer and the ESL may be removed together during formation of the via trench. Thus, the shifting portion of via trench may punch through the second ESL and inserting into the first ILD layer. Therefore, the later formed via including two portions, i.e. a first portion over the lower level metal line and a second portion formed besides the first portion and inserting into the first ILD layer. This second portion of the via is also called a tiger-tooth portion, which reduce the distance between the via and the adjacent lower level adjacent metal line. In some critical situations, the tiger-tooth portion of the higher level conductive feature may form breakdown path and induce current leakage to the adjacent lower level conductive feature.

However, in the present disclosure, a SAS layer 218 is formed between the first ILD layer 208 and the second ESL 220. Due to the different etching selectivity of SAS layer 218 and the second ESL 220, the shifting portion of the via trench stops at SAS layer 218. Therefore, as depicted in FIG. 8, via 226 in the present disclosure includes two portions, i.e. a first portion 226-1 over metal line 210A and a second portion 226-2 landing on SAS layer 218. In other words, SAS layer 218 stops via 226 from punching into the first ILD layer 208. Thus, a distance D1 between via 226 (the higher level conductive feature) and the adjacent metal line 210B (the adjacent lower level conductive feature) is ensured. The breakdown path and/or current leakage issues are mitigated and reliability of device 200 is increased. The fabrication of the second conductive feature in the present disclosure is referred to as a self-aligned scheme.

Now referring to FIG. 1, at operations 120, further processes are performed to complete the fabrication of device 200. For example, it may form various contacts/vias, wires, and multilayer interconnect features (such as ILD layer(s), ESL(s)) over device 200 according to the design requirement of device 200.

Method 100 may further include an operation 104 between operation 102 (receiving a starting semiconductor device with a first conductive feature formed in a first ILD layer) and operation 106 (forming a capping layer on the first conductive feature). FIGS. 9-16 illustrate cross-sectional views of device 200 at intermediate stages of method 100 including operation 104. Same reference numbers in FIGS. 9-16 refer to the same components/structures of device 200 as those in FIGS. 2-8, which include same materials and are formed by the same fabrication processes as aforementioned. The critical dimension of the same component/structure is also the same as aforementioned unless it is explicitly recited below.

Figure 9:
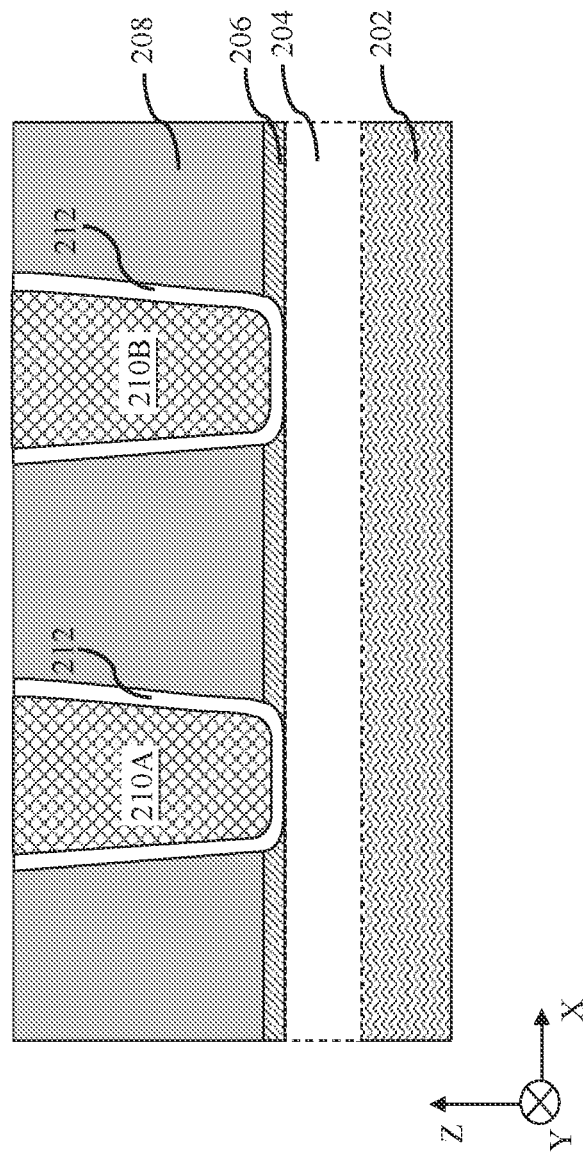
FIGS. 9-16 illustrate cross-sectional views of the example semiconductor device at intermediate stages of the method of FIG. 1 in accordance with some other embodiments of the present disclosure.

Referring to FIGS. 1 and 9, a starting semiconductor device 200 is received. Starting device 200 in FIG. 10 includes the same components/structures as that in FIG. 2.

Figure 10:
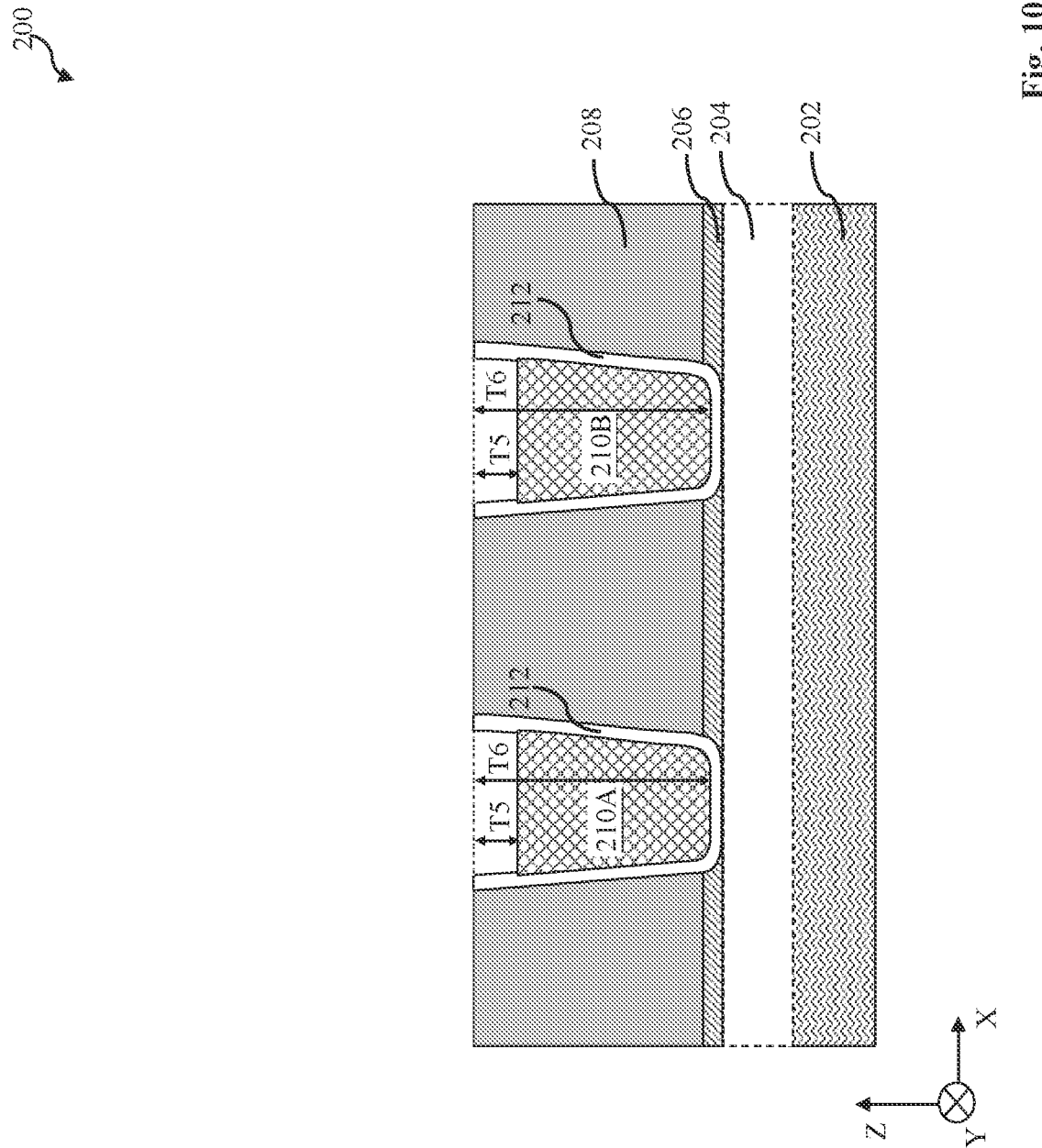

Referring to FIGS. 1 and 10, at operation 104, top portions of the first conductive features 210 (metal lines 210A and 210B) are recessed such that top surfaces of the first conductive features 210A and 210B are below the top surface of the first ILD layer 208. In some embodiments, top portions of the first conductive features 210 are removed by wet cleaning. Due to the different materials of barrier layer 212, the first conductive features 210, and the first ILD layer 208, the wet cleaning process only removes the top portions of the first conductive features 210, while barrier layer 212 and the first ILD layer 208 remain substantially unchanged. In some embodiments, device 200 is soaked in a wet etchant, such as diluted HF, or other suitable chemicals, or combinations thereof. The extent of the recession may be tunable or quantitatively controllable via the adjustment of various process conditions such as time and temperature. In some embodiments, a recession extent T5 of the first conductive features 210 is about 10% to about 20% of a height T6 of the first conductive features 210. In some further embodiments, thickness T5 is about 2 nm to about 5 nm.

Figure 11:
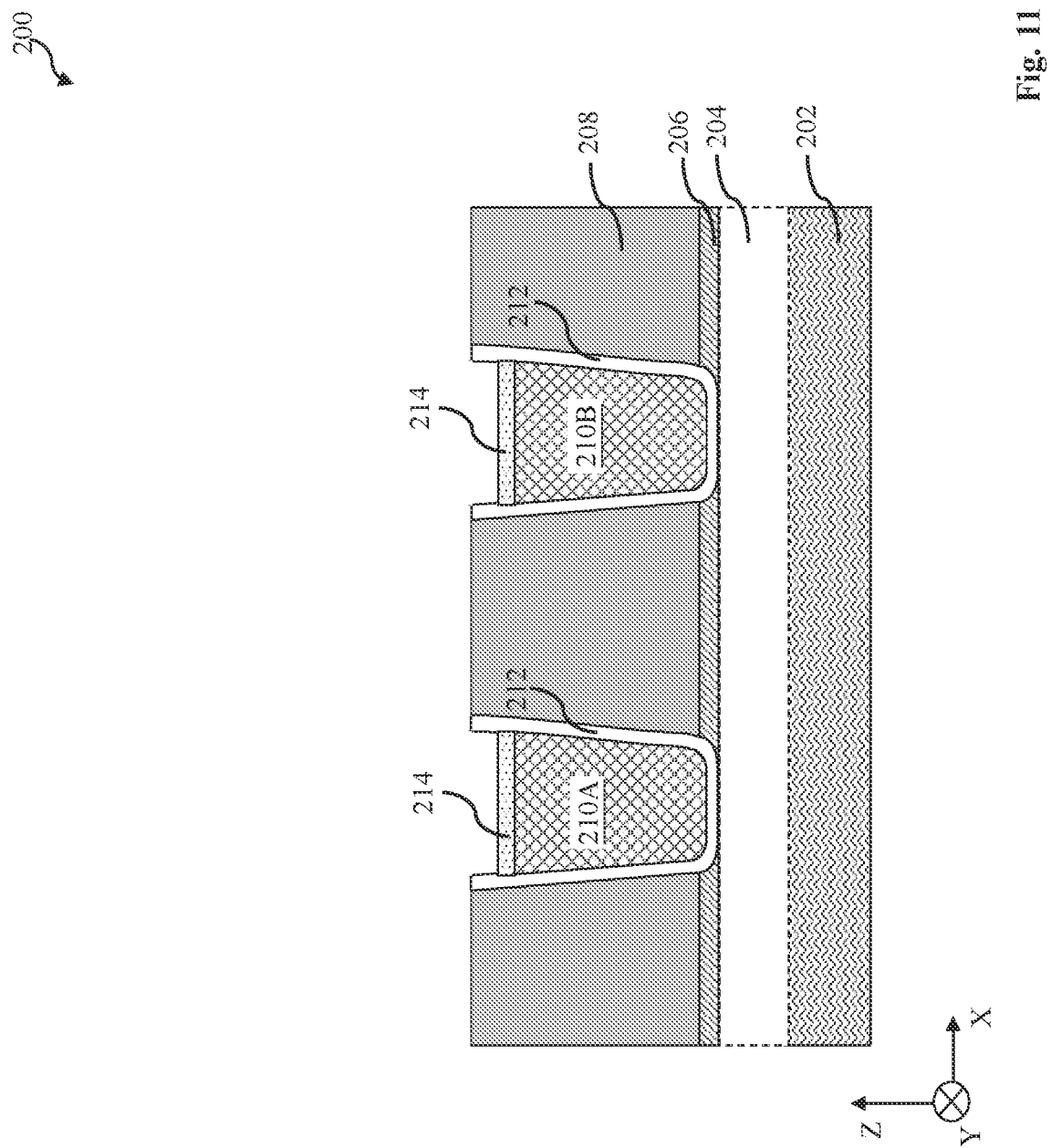
Figure 12:
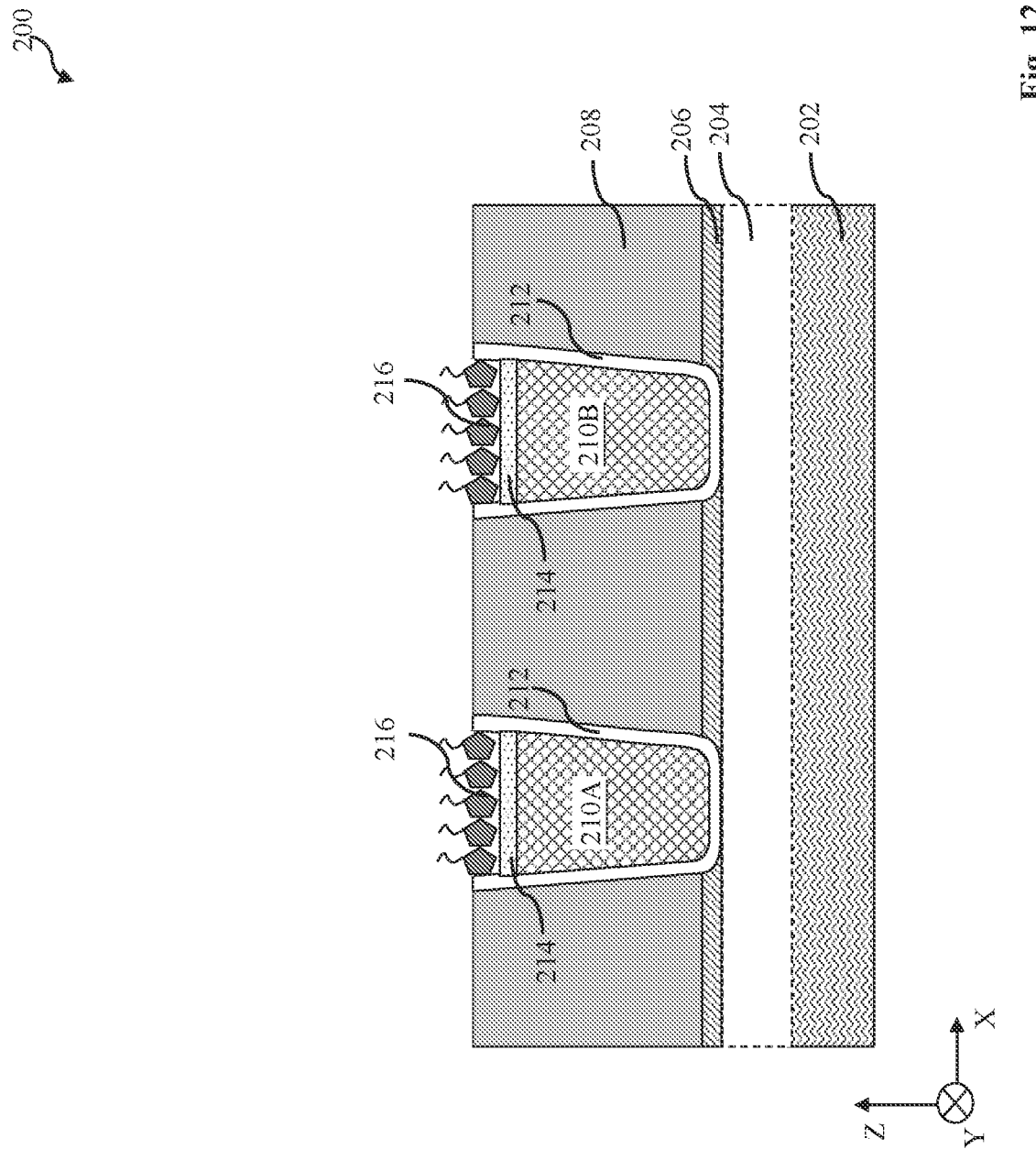

Referring to FIGS. 1 and 11, at operation 106, a capping layer 214 is deposited over the first conductive features 210. In some embodiments, capping layer 214 may be considered as a portion of the first conductive feature 210. As depicted in FIGS. 11 and 12, the top surface of capping layer 214 is below the top surface of the first ILD layer 208.

Figure 13:
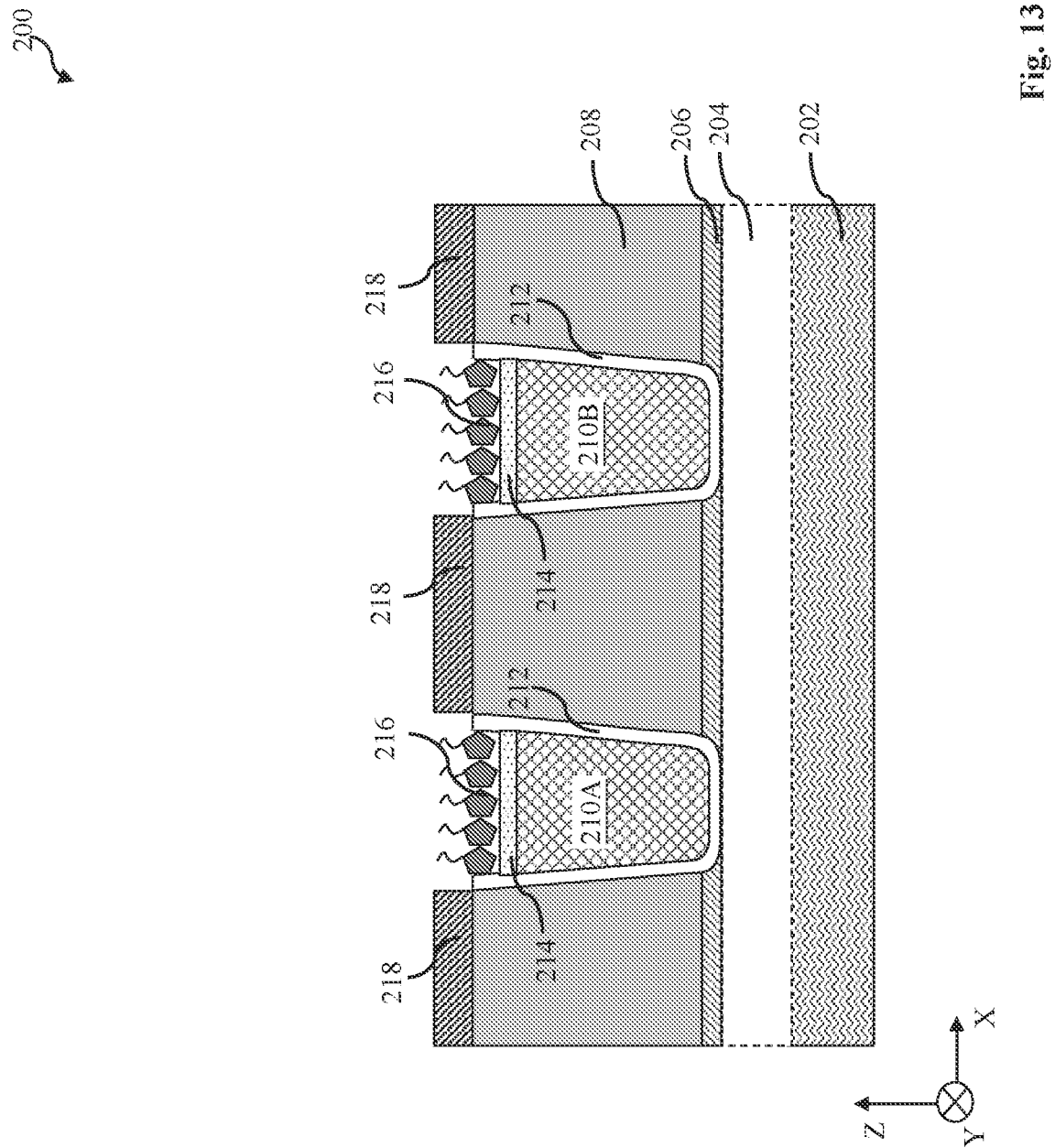

Referring to FIGS. 1 and 12, at operation 108, a blocking layer 216 is formed over the conductive capping layer 214, without touching the dielectric material of the first ILD layer 208. As depicted in FIGS. 12 and 13, the top surface of blocking layer 216 is above the top surface of the first ILD layer 208.

Referring to FIGS. 1 and 13, at operation 110, a dielectric SAS layer 218 is formed over the first ILD layer 208 and is distanced away from the first conductive features 210, as well as barrier layer 212. Similar as discussed above, due to the different chemical affinity, SAS layer 218 does not bond with blocking layer, such that it only formed on and aligned with the first ILD layer 208.

Figure 14:
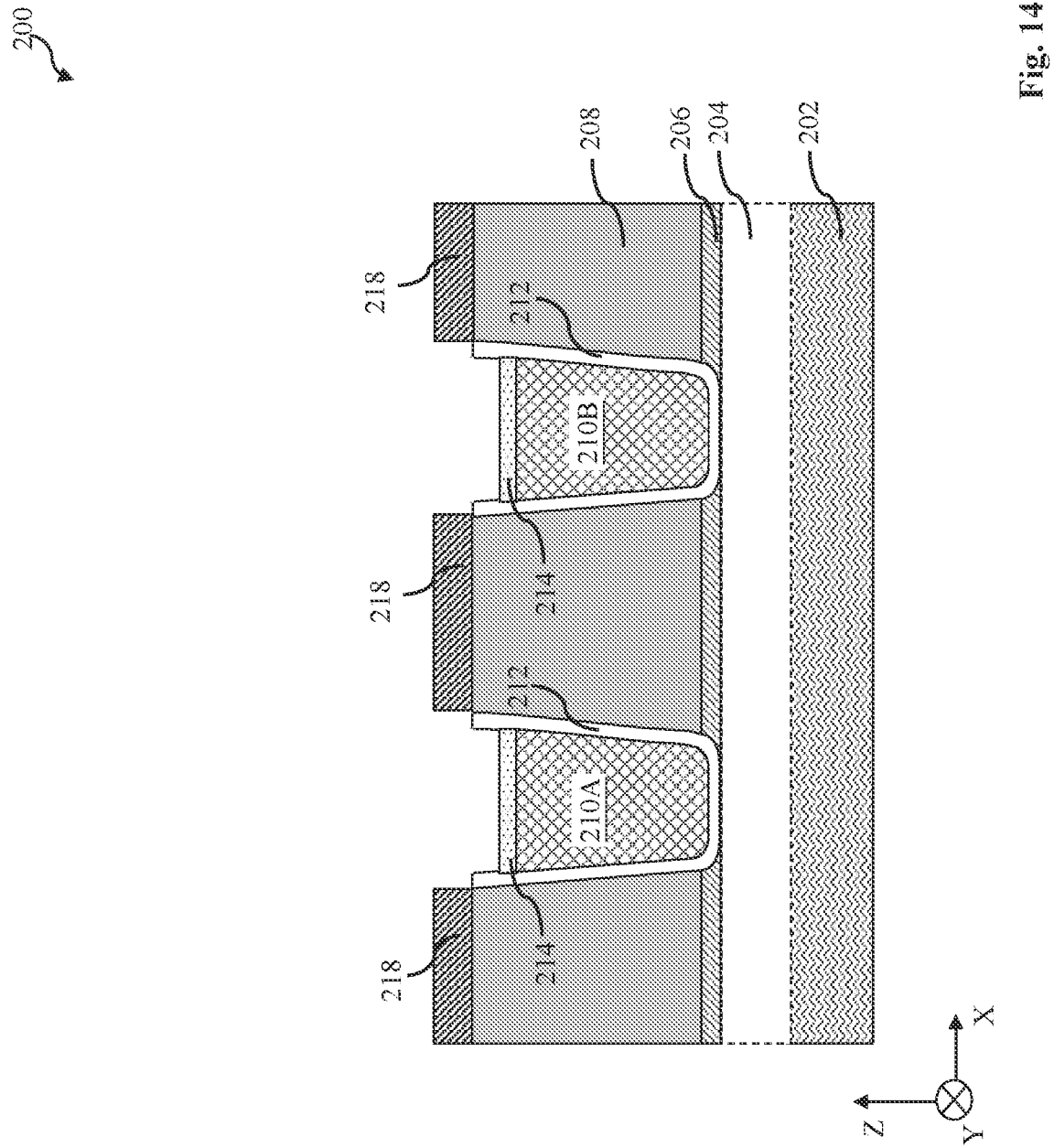

Referring to FIGS. 1 and 14, at operation 112, blocking layer 216 is removed, such that the top surface of capping layer 214 and the top surface and at least portions of the sidewall surfaces of barrier layer 212 are exposed from the top portion of device 200.

Figure 15:
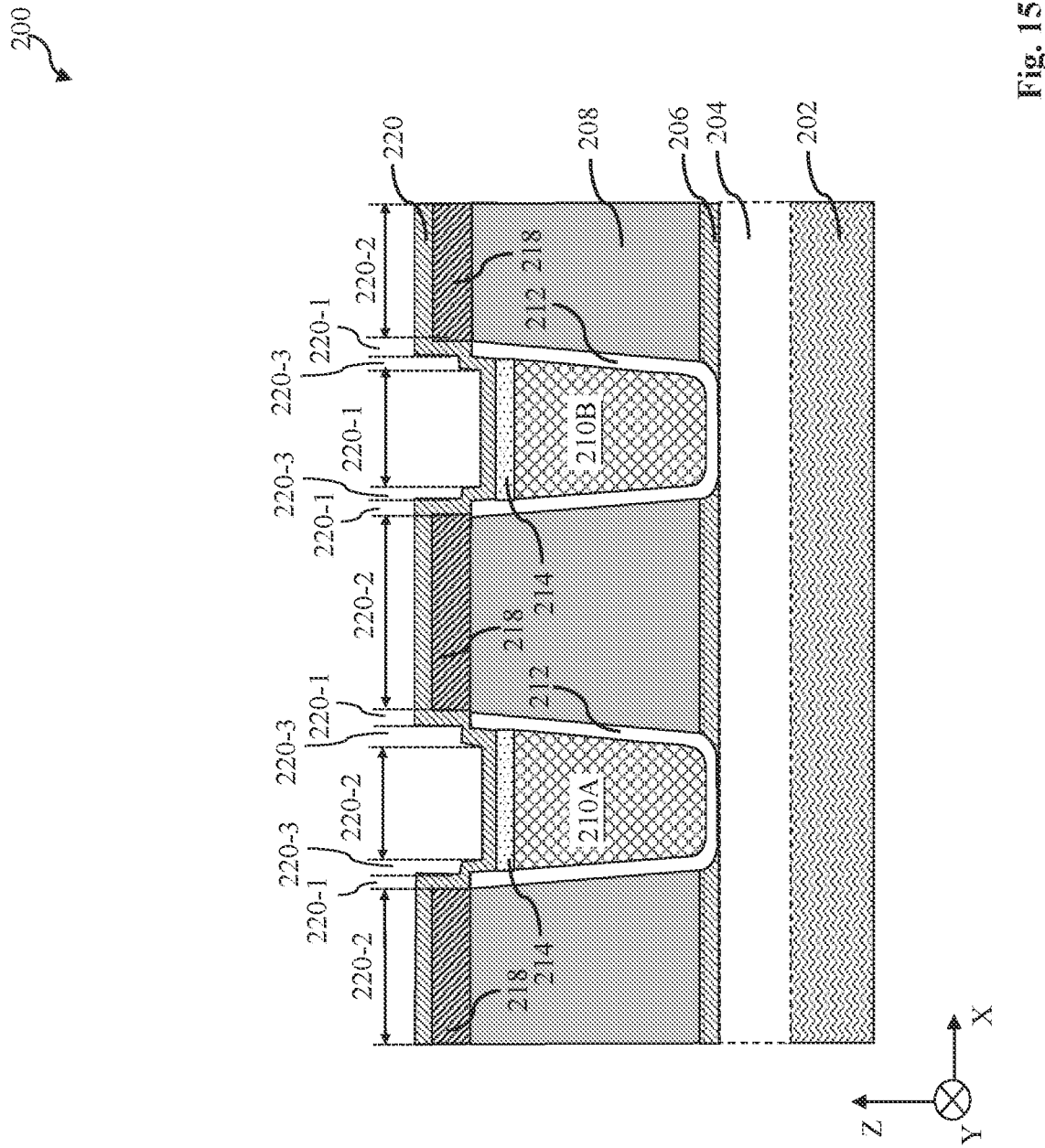

Referring to FIGS. 1 and 15, at operation 114, a second ESL 220 is deposited over device 200. As depicted in FIG. 15, due to the thickness difference between SAS layer 218 and barrier layer 212 and between barrier layer 212 and capping layer 214, the second ESL 220 forms steps over SAS layer 218, barrier layer 212, and capping layer 214. The second ESL 220 extends from the top surfaces of SAS layer 218, along sidewall surfaces of SAS layer 218, further extends over the top surfaces and along portions of sidewall surfaces of barrier layer 212, and further extends over the top surfaces of capping layer 214. Referring to FIG. 15, the second ESL 220 includes three portions, i.e. first portions 220-1 contacting the sidewall surfaces of SAS layer 218, second portions 220-2 covering the top surfaces of SAS layer 218 and the top surfaces of capping layer 214, and third portions 220-3 contacting portions of the sidewall surfaces of barrier layer 212.

Figure 16:
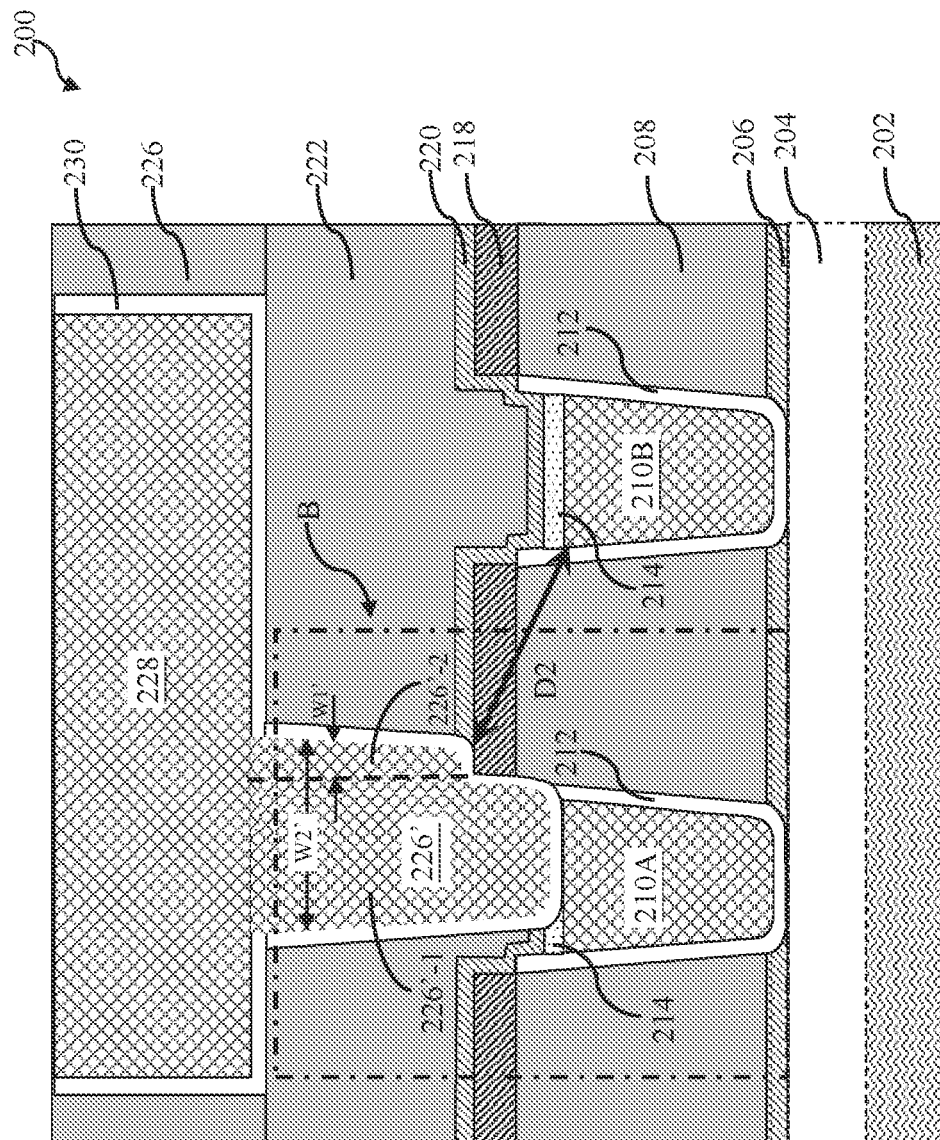

Referring to FIGS. 1 and 16, at operations 116 and 118, more conductive features, i.e. via 226' and metal line 228, are formed over the first conductive feature 210A (metal line 210A). The formation processes and material of via 226' and metal line 228 are similar as via 226 and metal line 228 in FIG. 8. In the example of FIG. 16, via 226' includes a first portion 226'-1 disposed metal line 210A and a second portion (tiger-tooth portion) 226'-2 landing on SAS layer 218. In some embodiments, a shifting ration, i.e. a ration of a width W1' of the second portion 226'-2 to a width W2' of via 226' is about 15% to about 30%. Here, the width W1' and the width W2' are the average width of the second portion 226'-2 and the average width of via 226' in the X-direction, respectively. Due to the recessing process at operation 104, each of the first conductive features (metal lines) 210A and 210B has a top surface below the bottom surface of SAS layer 218 (i.e. the top surface of the first ILD layer 208). Therefore, the distance D2 between the tiger-tooth portion 226'-2 of via 226' and the adjacent metal line 210B in FIG. 16 is greater than the distance D1 between the tiger-tooth portion 226-2 of via 226 and the adjacent metal line 210B in FIG. 8, both are greater than the distance between the tiger-tooth portion of the via and the adjacent lower level metal line in a conventional semiconductor device. Compare the embodiments of FIG. 16 and FIG. 8, due to the increased distance D2, the breakdown path/current leakage issues are further mitigated, the reliability of semiconductor device is further increased, the via-to-line parasitic capacitance is further reduced, and the speed of device 200 is boosted.

Referring to FIG. 1, at operations 120, further processes may be performed to complete the fabrication of device 200.

Figures 17A, 17B:
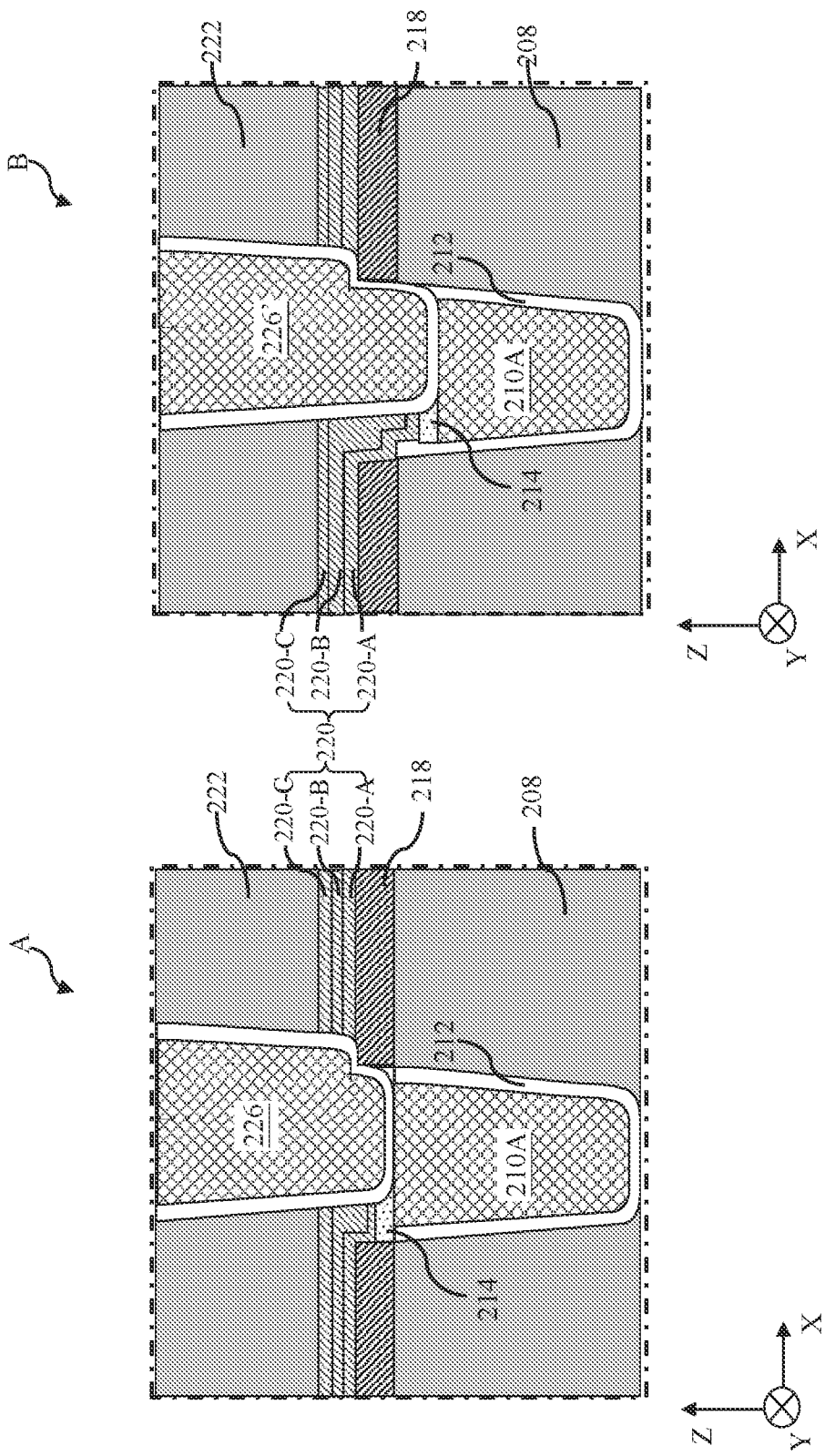
FIGS. 17A and 17B illustrate cross-sectional views of block A of FIG. 8 and block B of FIG. 16, respectively, in accordance with some further embodiments of the present disclosure.

FIGS. 17A and 17B illustrate cross-section views of some other embodiments of device 220. Only portions of device 200 in block A of FIG. 8 and block B of FIG. 16 are illustrated in FIGS. 17A and 17B, respectively. As depicted in each of FIGS. 17A and 17B, the second ESL 220 includes a multi-layer structure. For example, in FIG. 17A, the second ESL 220 includes a first ESL film 220-A having a portion contacting the sidewall surfaces of SAS layer 218 and forming a step extending from the top surface of SAS layer 218 to the top surface of capping layer 214, and a second ESL film 220-B disposed over the first ESL film 220-A. The first ESL film 220-A may be formed by ALD, and the second film 220-B may be formed by CVD and/or PVD. The material of the second ESL film 220-B may be merged over the top of the first conductive feature 210A during the CVD or PVD process, thus may form a substantially flat top surface. Thereby, the height difference of the first ESL film 220-A is flattened by the second ESL film 220-B. In some embodiments, the second ESL layer 220 may also include more ESL films, such as a third ESL film 220-C as depicted in FIG. 17A, deposited over the previous ESL film by CVD, PVD, ALD, other suitable process, or combinations thereof. Similarly, in FIG. 17B, the second ESL 220 may include a first ESL film 220-A having first portion(s) contacting the sidewall surface(s) of SAS layer 218, second portion(s) contacting portions of the sidewall surface(s) of barrier layer 212, and forming steps extending from the top surface of SAS layer 218 to the top surfaces of barrier layer 212, and further to the top surface of capping layer 214. The second ESL 220 may also include a second ESL film 220-B disposed over the first ESL film 220-A. The first ESL film 220-A may be formed by ALD, and the second film 220-B may be formed by CVD and/or PVD, such that the height difference of the first ESL film 220-A is flattened by the second ESL film 220-B. In some embodiments, the second ESL layer 220 may also include more ESL films, such as a third ESL film 220-C as depicted in FIG. 17B, deposited over the previous ESL film by CVD, PVD, ALD, other suitable process, or combinations thereof.

Although not intended to be limiting, one or more embodiments of the present disclosure provide many benefits to a semiconductor device and a formation process thereof. For example, embodiments of the present disclosure provide a semiconductor device with conductive interconnect structure(s) formed with a self-aligned scheme. In the present disclosure, a dielectric SAS layer is formed between the upper level ESL (for example, the second ESL 220) and the lower level ILD layer (for example, the first ILD layer 208). The SAS layer includes a dielectric material that is different from the material of the upper level ESL and the upper level ILD, such that the SAS layer may remain substantially unchanged during the formation of the upper level conductive feature. Thereby, the SAS layer can stop the upper level conductive feature from breaking down to the lower level ILD layer, thereby the distance between the upper level conductive feature (for example, via 226) and the adjacent lower level conductive feature (for example, metal line 210B) is enlarged. Therefore, the semiconductor device has better reliability due to the reducing of the breakdown path/current leakage issues. In some embodiments, a recessing process if performed to the lower level conductive feature to further enlarge the distance between the upper level conductive feature and the adjacent lower level conductive feature, thereby to reduce the parasitic capacitance and further improve the performance of the semiconductor device. The fabrication process can be integrated in the current process flow and can be applied to multiple technology generations.

The present disclosure provides for many different embodiments. An exemplary semiconductor device comprises an interlayer dielectric (ILD) layer disposed over a substrate; a first conductive feature at least partially embedded in the ILD layer; a dielectric layer disposed over and aligned with the ILD layer, wherein a top surface of the dielectric layer is above a top surface of the first conductive feature; an etch stop layer (ESL) disposed over the dielectric layer and over the first conductive feature; and a second conductive feature disposed on the first conductive feature, wherein the second conductive feature includes a first portion having a first bottom surface contacting a top surface of the first conductive feature and a second portion having a second bottom surface contacting a top surface of the dielectric layer.

In some embodiments, the semiconductor device further comprises a capping layer disposed on and aligned with the first conductive feature. In some embodiments, a thickness of the dielectric layer is greater than a thickness of the capping layer such that the dielectric layer includes a sidewall surface extended above the capping layer. In some embodiments, the ESL includes a portion contacting the sidewall surface of the dielectric layer and wherein the ESL extends from the top surface of the dielectric layer to a top surface of the capping layer. In some embodiments, the ESL includes a first ESL film having a portion contacting the sidewall surface of the dielectric layer and extending from the top surface of the dielectric layer to the top surface of the capping layer, and a second ESL film disposed over the first ESL film.

In some embodiments, the semiconductor device further comprises a barrier layer surrounding the first conductive feature and disposed between the first conductive feature and the ILD layer. In some embodiments, the dielectric layer is distanced away from the first conductive feature.

In some embodiments, a top surface of the ILD layer is above the top surface of the first conductive feature.

Another semiconductor device comprises an interlayer dielectric (ILD) layer disposed over a substrate; a first conductive feature embedded in the ILD layer, wherein a top surface of the first conductive feature is below a top surface of the ILD layer; a dielectric layer formed on and aligned with the ILD layer; and an etch stop layer (ESL) disposed over the dielectric layer and the first conductive feature, wherein the ESL includes a first portion contacting a sidewall surface of the dielectric layer and extending from the top surface of the dielectric layer to the top surface of the first conductive feature.

In some embodiments, the semiconductor device further comprises a barrier layer surrounding the first conductive feature and disposed between the first conductive feature and the ILD layer, wherein the ESL further includes a second portion disposes on a sidewall surface of the barrier layer. In some embodiments, the top surface of the first conductive feature is below a top surface of the barrier layer and further below a top surface of the dielectric layer. In some embodiments, the first conductive feature comprises a metal plug and a capping layer disposed on and aligned with the metal plug. In some embodiments, the semiconductor device further comprises a second conductive feature including a first portion landing on the first conductive feature and a second portion landing on the dielectric layer through the ESL layer.

An exemplary method includes forming a first conductive feature in an interlayer dielectric (ILD) layer over a substrate; selectively depositing a capping layer on and aligned with the first conductive feature; selectively coating a blocking layer on and aligned with the capping layer; depositing a dielectric layer over and aligned with the ILD layer, wherein the blocking layer includes a composition to prevent the dielectric layer from being deposited thereon; removing the blocking layer to expose the capping layer; and depositing an etch stop layer (ESL) on the dielectric layer and the capping layer.

In some embodiments, the method further includes recessing the first conductive feature before forming the capping layer, such that a top surface of the first conductive feature is below a top surface of the ILD layer. In some embodiments, selective depositing the capping layer on and aligned with the first conductive feature includes depositing the capping layer with a thickness such that a top surface of the capping layer is below the top surface of the ILD layer.

In some embodiments, selectively coating a blocking layer includes depositing a nitrogen-containing self-assembling monolayer by a chemical adsorption process. In some embodiments, depositing a dielectric layer includes depositing the dielectric layer comprising metal oxide or metal nitride by a selective atomic layer deposition (ALD). In some embodiments, removing the blocking layer includes removing the block layer by a hydrogen treatment. In some embodiments, selectively depositing a capping layer includes selectively depositing a cobalt-containing layer by a chemical vapor deposition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first dielectric layer disposed on a substrate;
    a first conductive component at least partially embedded in the first dielectric layer;
    a second dielectric layer disposed on the first dielectric layer, wherein at least a portion of a top surface of the first conductive component is recessed relative to respective top surfaces of the first and second dielectric layers;
    a capping layer disposed directly on the top surface of the first conductive component such that the capping layer physically contacts the top surface of the first conductive component;
    an etch stop layer disposed directly on the second dielectric layer and the capping layer such that the etch stop layer physically contacts the second dielectric layer and the capping layer; and
    a second conductive component disposed directly on the first conductive component, wherein the second conductive component physically contacts the first conductive component, the second dielectric layer, the etch stop layer and the capping layer.

2. The device of claim 1, wherein the first conductive component includes a first metal line and the second conductive component includes a via and a second metal line.

3. The device of claim 1, wherein the second dielectric layer includes a material selected from the group consisting of silicon carbide (SiC), silicon dioxide (SiO$_2$), silicon oxy-carbide (SiOC), silicon nitride (SiN), silicon carbonitride (SiCN), silicon oxy-nitride (SiON), silicon oxy-carbonitride (SiOCN).

4. The device of claim 1, wherein the second dielectric layer is thicker than the capping layer.

5. The device of claim 1, wherein the first conductive component includes a barrier layer and a conductive fill material, and
    wherein the conductive fill material has a top surface that is recessed relative to a top surface of the barrier layer.

6. The device of claim 5, wherein the top surface of the barrier layer and the top surface of the first dielectric layer are positioned at the same height above the substrate.

7. The device of claim 1, wherein the second conductive component includes a barrier layer and conductive material, and
    wherein the barrier layer physically contacts the first conductive component, the second dielectric layer, the etch stop layer and the capping layer.

8. The device of claim 1, wherein the etch stop layer includes:
    a first etch stop layer physically contacting the second dielectric layer, the capping layer and the second conductive component, and
    a second etch stop layer physically contacting the first etch stop layer and the second conductive component.

9. A device comprising:
    an first dielectric layer disposed on a substrate;
    a first conductive feature disposed in the first dielectric layer, wherein a top surface of the first conductive feature is recessed relative to the top surface of the first dielectric layer;
    a first barrier layer disposed in the first dielectric layer between the first conductive feature and the first dielectric layer, the first barrier layer having a sidewall surface interfacing with the first conductive feature;
    a capping layer disposed directly on the top surface of the first conductive feature and interfacing with the sidewall surface of the first barrier layer;
    a second dielectric layer disposed directly on the top surface of the first dielectric layer; and
    an etch stop layer extending form over the second dielectric to the capping layer, wherein the etch stop layer interfaces with the sidewall surface of the first barrier layer.

10. The device of claim 9, further comprising:
    a third dielectric layer disposed on the second dielectric layer,
    a second conductive feature extending through the third and second dielectric layers; and
    a second barrier layer extending along the second conductive feature to the capping layer.

11. The device of claim 10, wherein a portion of the second conductive feature and a portion of the second barrier layer are disposed directly over the second dielectric layer.

12. The device of claim 9, wherein the etch stop layer includes more than one layer, and wherein at least one layer of the etch stop layer interfaces with the sidewall surface of the first barrier layer.

13. The device of claim 9, wherein the second dielectric layer includes a first portion and a second portion that is spaced apart from the first portion, wherein the first portion of the second dielectric layer has a first sidewall and the second portion of the second dielectric layer has a second sidewall that faces the first sidewall, and wherein the etch stop layer interfaces with the first sidewall of the first portion of the second dielectric layer and the second barrier layer interfaces with the second sidewall of the second portion of the second dielectric layer.

14. The device of claim 9, wherein a top surface of the first conductive feature is recessed relative to a top surface of the first barrier layer.

15. The device of claim 14, wherein the etch stop layer interfaces with the top surface of the first barrier layer.

16. A method comprising:
  forming a first conductive component in a first dielectric layer;
  forming a capping layer directly on the first conductive component;
  forming a blocking layer directly on the capping layer;
  forming a second dielectric layer directly on the first dielectric layer;
  after forming the second dielectric layer, removing at least a portion of the blocking layer to expose the capping layer; and
  forming a second conductive component directly on the capping layer.

17. The method of claim 16, wherein the forming of the second dielectric layer directly on the first dielectric layer occurs after the forming of the blocking layer directly on the capping layer.

18. The method of claim 16, wherein the forming of the first conductive component in the first dielectric layer includes:
  forming a first trench in the first dielectric layer;
  forming a first barrier layer in the first trench; and
  forming a first conductive material on the first barrier within the first trench, and
  wherein the forming of the second conductive component directly on the capping layer includes:
  forming a third dielectric layer over the second dielectric layer;
  forming a second trench in the third dielectric layer;
  forming a second barrier layer in the second trench; and
  forming a second conductive material on the second barrier within the second trench.

19. The method of claim 16, further comprising:
  forming an etch stop layer directly on the exposed capping layer after the removing of at least the portion of the blocking layer to expose the capping layer, and
  removing a portion of the etch stop layer to expose the capping layer prior to forming the second conductive component directly on the capping layer.

20. The method of claim 16, wherein the forming of the blocking layer directly on the capping layer includes forming a self-assembling monolayer material directly on the capping layer, and
  wherein the removing of at least the portion of the blocking layer to expose the capping layer includes performing a gas based treatment process to remove at least the portion of the blocking layer.

\* \* \* \* \*